(12) United States Patent  
Damadian et al.

(10) Patent No.: US 7,834,630 B2
(45) Date of Patent: Nov. 16, 2010

(54) MRI TEST FIXTURE

(75) Inventors: Raymond V. Damadian, Woodbury, NY (US); Hugh Wahl, Stony Brook, NY (US); Rein Aspelund, Farmingville, NY (US); James Kelly, Bellerose, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 12/316,102

(22) Filed: Dec. 9, 2008

(65) Prior Publication Data

US 2009/0167305 A1    Jul. 2, 2009

Related U.S. Application Data

(62) Division of application No. 09/992,733, filed on Nov. 14, 2001, now Pat. No. 7,504,827.

(51) Int. Cl.
*G01V 3/00* (2006.01)

(52) U.S. Cl. ..................... 324/318; 324/309

(58) Field of Classification Search ......... 324/300–322; 600/407–445; 333/219–235; 343/741–744, 343/757–771, 787–788
See application file for complete search history.

(56) References Cited

U.S. PATENT DOCUMENTS

| | | | |
|---|---|---|---|
| 3,401,405 A | 9/1968 | Erickson | |
| 3,445,649 A | 5/1969 | Littlejohn et al. | |
| 3,534,251 A | 10/1970 | Richards | |
| 3,555,472 A | 1/1971 | Resser, Jr. | |
| 4,642,569 A | 2/1987 | Hayes et al. | |
| 4,725,781 A | 2/1988 | Roschmann | |
| 4,733,190 A | 3/1988 | Dembinski | |
| 4,888,555 A | 12/1989 | Vaughan et al. | |
| 5,053,711 A | 10/1991 | Hayes et al. | |
| 5,081,418 A | 1/1992 | Hayes et al. | |
| 5,165,050 A | 11/1992 | Goodenough et al. | |
| 5,242,455 A | 9/1993 | Skeens et al. | |
| 5,245,280 A | 9/1993 | Beranger et al. | |
| 5,432,449 A | 7/1995 | Ferut et al. | |
| 5,534,776 A | 7/1996 | Leger et al. | |
| 5,551,430 A | 9/1996 | Blakeley et al. | |
| 5,754,048 A | 5/1998 | Bielecki | |
| 5,876,337 A | 3/1999 | Tsuda | |
| 5,952,734 A | 9/1999 | Gelbien | |
| RE36,495 E | 1/2000 | Blakeley et al. | |
| 6,023,165 A | 2/2000 | Damadian et al. | |
| 6,025,718 A | 2/2000 | Hushek | |
| 6,037,775 A | 3/2000 | Shenoy et al. | |
| 6,075,364 A | 6/2000 | Damadian et al. | |

(Continued)

*Primary Examiner*—Brij B Shrivastav
(74) *Attorney, Agent, or Firm*—Brandon N. Sklar, Esq.; Kaye Scholer LLP

(57) ABSTRACT

In one example, a magnetic resonance imaging ("MRI") system comprises a magnetic resonance imaging assembly defining a gap region, a transmitting coil proximate the gap region, and at least one test coil separate from the transmitting coil. The at least one coil is mechanically coupled to the assembly during imaging and the at least one test coil is selectively electrically coupled to the assembly to collect test data. The at least one coil may be coupled to a test fixture coupled to the assembly. The test fixture may be deployable from a first position to a second position for collection of test data. The at least one coil may comprise a first test coil and a second test coil. Methods are also disclosed.

20 Claims, 12 Drawing Sheets

U.S. PATENT DOCUMENTS

| | | |
|---|---|---|
| 6,099,459 A | 8/2000 | Jacobson |
| 6,137,291 A | 10/2000 | Szumowski et al. |
| 6,157,193 A * | 12/2000 | Renz et al. ............. 324/318 |
| 6,166,543 A | 12/2000 | Sezginer et al. |
| 6,201,394 B1 | 3/2001 | Danby et al. |
| 6,208,145 B1 | 3/2001 | Danby et al. |
| 6,242,915 B1 | 6/2001 | Hurd |
| 6,366,086 B1 | 4/2002 | Sen |
| 6,368,329 B1 | 4/2002 | Truwit |
| 6,492,815 B2 | 12/2002 | Hinks et al. |
| 6,507,190 B1 | 1/2003 | Hinks et al. |
| 6,512,373 B1 | 1/2003 | Griffin et al. |
| 7,215,231 B1 * | 5/2007 | Morrone ................. 335/299 |
| 7,504,827 B1 | 3/2009 | Damadian et al. |
| 7,511,500 B2 * | 3/2009 | Schiano et al. .......... 324/318 |
| 2004/0046577 A1 * | 3/2004 | Pfaff et al. .............. 324/752 |

* cited by examiner

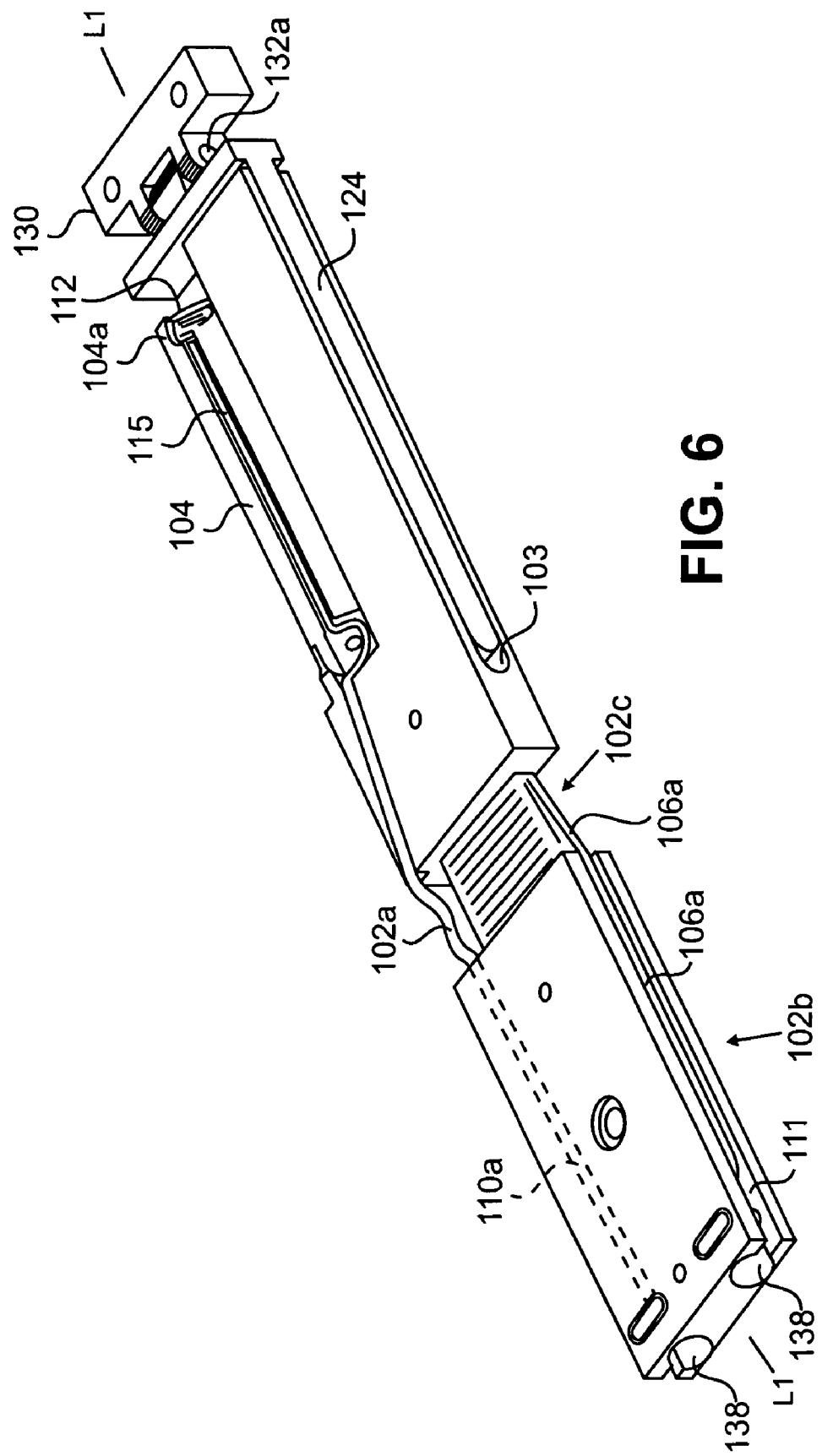

CONTROL +5V

MRI TEST FIXTURE

The present application is a division of U.S. patent application Ser. No. 09/992,733, which was filed on Nov. 14, 2001, is assigned to the assignee of the present application, and is incorporated by reference herein

FIELD OF THE INVENTION

Background of the Invention

Magnetic Resonance Imaging ("MRI") is a highly useful technique for diagnosing abnormalities in biological tissue. Medical MRI requires creation of a substantially constant "primary" magnetic field, which passes through a patient's body. The patient is also exposed to electromagnetic waves in the radio frequency range, which vary with time in particular patterns. Under the influence of the magnetic fields and the radio waves, certain atomic nuclei within the patient's tissues resonate and emit other radio frequency waves, referred to as MR signals. Linear time varying "gradient" magnetic fields are typically superimposed on the primary field, based on the desired scanning sequence, to encode the MR signals in space and to select the desired image slice. An image of a volume of tissue is constructed with varying intensities corresponding to the concentration and/or physical state of certain nuclei of interest, by known mathematical techniques for correlating the magnetic field gradient patterns applied during the pulse sequence with the MR signals emitted by the patient. The concentrations or physical states of different substances ordinarily differ for differing kinds of tissues within the body, affecting the intensities in the image. Certain abnormalities in tissue, such as tumors, may be identified.

An MRI system is a highly complex, sensitive system. FIG. 1 is a schematic representation of a typical MRI system 10, comprising a magnet assembly with a gap region 50 (indicated schematically). A patient 11 is exposed to a primary magnetic field B within the gap region. A gradient coil system Gxt, Gy, Gz is provided in the gap region to establish linear, time varying gradient magnetic fields in three dimensions necessary for a particular scanning sequences. The gradient coil system is controlled by a gradient controller. Shimming coils (not shown) are also provided in the gap region to cancel non-uniformities in the primary magnetic field. A transmitter coil 26 for transmitting radio frequency pulses to the patient during the scanning sequence and a receiver coil 30 for picking up magnetic resonance signals during an actual scan are provided, as well. The same coil can act as both the transmitter and receiver coil, as is known in the art. The transmitter coil 26 is driven by an RF subsystem 24 though a variable amplifier 28. The receiver coil 30 is typically coupled to a pre-amplifier 32 and a variable amplifier 34, that amplify the received MR signals to an adequate level for further processing. A frequency down converter 36 is typically provided to shift the amplified signals, which are in a high frequency range, to a lower frequency range suitable for analog-to-digital ("A/D") conversion by an A/D converting array 38. The A/D converting array 38 is coupled to a digital data processor 20, which filters and processes the data. The data processor 20 provides the processed data to a computer 14, which further processes the data for display by an image display system 16. An NMR sequence and timing controller 18 typically provides synchronization pulses to the major subsystems of the MRI system 10 to coordinate their operations. The computer 14 controls overall operation of the major subsystems of the MRI system 10.

Typically, the magnetic field strength in the patient receiving gap is greater than 300 gauss. 1 to 15 kilogauss are common. In addition to a strong magnetic field, medical MRI requires a magnetic field stability of the order of a few parts per million. One part per million or less is preferred. Deviations from proper performance can arise in any of the subsystems or components of the MRI system due to component degradation, power supply fluctuations, drift of analog components, environmental fluctuations, magnet drift and system or component failure, for example. In addition, it is often necessary to locate an MRI system in areas that have changing environmental magnetic fields, such as those generated by a third rail or the overhead wire of an electrical railway. Temperature fluctuations due to the changes in temperature during the course of a day or air conditioning, are also common environmental disturbances. In resistive magnets, the cooling water temperature is another source of temperature fluctuation.

Disruptions or drift in the primary magnetic field or the gradient magnetic fields, may cause ghosting, blurring and other artifacts in a resulting image. In severe cases, the imaging data may be completely destroyed. Considering the expense of an MRI procedure, as well as the discomfort of the patient, identification of deviations in the magnet and other problems in the system so that they can be corrected prior to conducting an imaging procedure is very important.

Images of test samples of material yielding a strong MR signal, such as petroleum jelly, water, salt water and nickel chloride, for example, have been used to identify deviations from desired behavior in MRI systems. The samples, referred to as phantoms, are placed in the imaging volume and subjected to a scanning sequence. The MR signals emitted by the sample are detected and compared to an expected response. Deviations from the expected response indicate a problem with the MRI system and may suggest where the problem is located. U.S. Pat. No. 5,432,449 discloses a test fixture comprising a mounting plate, a test coil and a receptor for a test sample. The test coil and the test sample are supported in a housing that fits within an aperture of the mounting plate. One or more spacer modules may be placed in the aperture to vary the distance of the test coil and the test sample from the mounting plate. The mounting plate is positioned on a table within the imaging volume for testing and is removed prior to imaging a subject.

U.S. Pat. No. 6,025,717, assigned to the assignee of the present invention, discloses a diagnostic simulator for evaluating individual subsystems of the MRI system, by selectively connecting the simulator to those subsystems of the MRI system. Data representative of a previously imaged object is provided to the selected subsystem in a proper form for processing by that subsystem. The data is also processed by subsystems downstream of the selected subsystem of the MRI system. An image may be constructed from the data and compared to a reference image, visually or by computer. By analyzing the results of the processing conducted by particular subsystems of the MRI system, problems may be isolated to a particular subsystem.

Other techniques for testing the MRI system include placing a probe in the gap region and implementing a pulse sequence. The probe may be connected to an oscilloscope or Teslameter to measure the magnetic field frequency and field strength. One diagnostic program for evaluating an MRI system developed by Fonar Corporation ("Fonar"), Melville, N.Y., assignee of the present invention, is referred to as MSSR, or multi-slice scan reconstruction. In MSSR, digital data representative of raw magnetic resonance imaging data of a real or simulated phantom object, such as a cube filled with nickel chloride, is reconstructed. An image file is generated from the reconstructed data and displayed. The displayed image is viewed for errors, such as image artifacts, to identify problems in the display or data processor of the MRI device. Image artifacts indicative of a problem include banding, multiple images or fuzziness (ghosting).

Another diagnostic program developed and used by Fonar is incorporated into Fonar's ULTIMATE™ scanner. Raw digital image data from an actual scan of a phantom sample is loaded into memory and the data is processed for viewing. Again, the data processing and display systems can be evaluated. A fixed frequency can also be injected into the receiver coil and a scan performed. The resulting image should be a distinct dot. Ghosting in the image indicates a temporal instability somewhere in the system.

SUMMARY OF THE INVENTION

In accordance with an embodiment of the invention, a magnetic resonance imaging system is disclosed comprising a magnetic resonance imaging assembly defining a gap region and at least one test coil. The at least one test coil is mechanically coupled to the assembly during imaging and the at least one test coil is selectively electrically coupled to the assembly to collect test data related to operating characteristics of the system. The system may comprise first and second, separate test coils. The first test coil may be mechanically coupled to the assembly in a first orientation and the second test coil may be mechanically coupled to the assembly in a second orientation different than the first orientation. The system may further comprise a container supported proximate the second test coil and a test substance capable of emitting a magnetic resonance signal, within the container. The first and second test coils may be mechanically coupled to the assembly in the first and second orientations, respectively, during operation to collect test data.

The magnetic resonance imaging system may further comprise a test fixture mechanically coupled to the assembly, proximate the gap region. The at least one test coil may be mechanically coupled to the test fixture. The test fixture may be pivotally coupled to the assembly within the gap region. The test fixture may be deployable into a position within the gap region. The magnetic resonance imaging assembly may define a chamber and the test fixture may be pivotally coupled to the assembly within the chamber. The test fixture may have an undeployed, first position parallel to the plate, within the chamber, and a deployed, second position extending from the chamber, into the gap region, to collect test data. The test fixture may comprise a body portion, a first test coil supported by the body portion, an arm pivotally coupled to the body portion, and a second test coil supported by the arm. A container may be supported by the arm, proximate the second coil, and a test substance capable of emitting a magnetic resonance signal may be provided within the container. The test fixture may further comprise a telescoping section for adjusting the length of the main body.

The assembly may comprise a ferromagnetic frame supporting first and second opposing poles defining a gap region therebetween. The test fixture may be pivotally coupled to one of the poles. The magnetic resonance imaging assembly may further comprise a first gradient coil plate adjacent to the first pole, a second gradient coil plate adjacent to the second pole, a first transmitter coil plate coupled to the first gradient coil plate, and a second transmitter coil plate coupled to the second gradient coil plate. The test fixture may be pivotally connected to the transmitting coil plate. The first transmitter coil plate may define a chamber for receiving the test fixture and the test fixture may be pivotally connected to the plate, within the chamber. Signal processing circuitry to process magnetic resonance signals and means for selectively coupling the at least one test coil to the signal processing circuitry, may be provided. The pole faces may have a polar Y axis extending through a center of the pole faces, and an X axis and a Z axis, each orthogonal to the Y axis and orthogonal to each other. The first test coil may be adapted to detect gradient magnetic fields generated by the gradient field coils. The first test coil may be positioned such that the first test coil is displaced from the X, Y and Z axes during operation to collect test data, and the second coil may be positioned at the intersection of the X, Y, and Z axes during operation to collect test data.

In accordance with another embodiment of the invention, a method of operating a magnetic resonance imaging system having a gap region, is disclosed comprising deploying at least one test coil mechanically and electrically coupled to the system, into a position with a predetermined orientation within the gap region, conducting a test procedure to evaluate at least one operating characteristic of the system, and detecting signals resulting from the test procedure by the at least one test coil. The method may further comprise conducting a magnetic resonance imaging scan with the magnetic resonance imaging system, while the test coil is mechanically coupled to the system and not electronically coupled to the system. The test coil may be coupled to at test fixture and the method may further comprise deploying the at least one coil by pivoting the test fixture from a first, storage position to a second, deployed position.

BRIEF DESCRIPTION OF THE FIGURES

FIG. 6 is a side perspective view of an implementation of the test fixture in an undeployed position, showing the structure of the body portions;

DETAILED DESCRIPTION OF THE PREFERRED EMBODIMENTS

Figure 2:
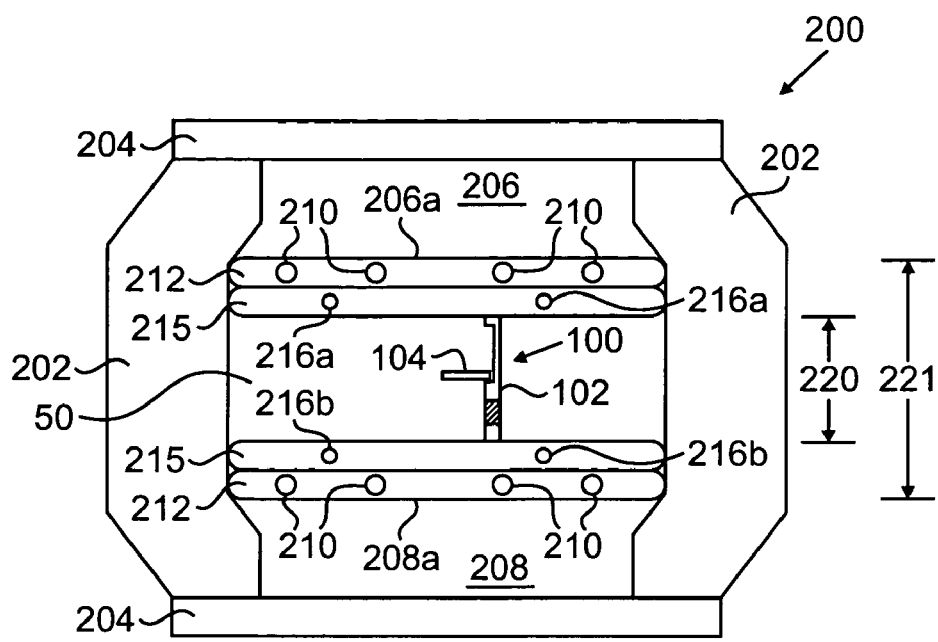
FIG. 2 is a side view of one embodiment of a test fixture deployed in the imaging volume between the poles of a magnet assembly of an Open Magnetic Resonance Imaging ("MRI") System, in accordance with the present invention.

FIG. 2 is a side view of one embodiment of a test fixture 100 deployed in the imaging volume 220 between the poles of a magnet assembly of an Open Magnetic Resonance Imaging ("MRI") System 200, in accordance with the present invention. In a preferred embodiment, the test fixture 100 comprises a vertically extending main body portion 102 and an arm 104.

In one embodiment, the Open MRI System 200 comprises a magnet assembly comprising a ferromagnetic frame supporting ferromagnetic poles. The ferromagnetic frame may comprise ferromagnetic elements 202 connected at their ends to opposing ferromagnetic pole supports 204. The ferromagnetic pole supports are plates that support upper and lower ferromagnetic poles 206, 208. The supporting elements may be ferromagnetic plates, as described in U.S. Pat. No. 6,201,394 B1, assigned to the assignee of the present invention and incorporated by reference herein, for example, or four ferromagnetic posts connected to the corners of the pole supports 204, as described in U.S. Pat. No. 6,201,394 B1, U.S. Pat. Nos. 6,014,070, 6,075,364 and 5,754,085, which are also assigned to the assignee of the present invention and are incorporated by reference herein. Another design is shown in U.S. Pat. No. 4,675,609, which is also assigned to the assignee of the present invention and is incorporated by reference, herein.

The upper and lower ferromagnetic poles 206, 208 have opposing pole faces 206a, 208a. The region between the opposing pole faces 206a, 208a is referred to as a gap region 221. Gradient field generating coils 210 are provided in a plate 212 adjacent to each of the poles 206, 208. Electromagnetic coils (not shown) for generating a magnetic field and shim coils (also not shown) for adjusting the magnetic field, are also provided, as is known in the art. Upper and lower transmitter coil plates 214, 215 are typically provided for supporting upper and lower portions 216a, 216b of a rectangular transmitter coil 216, respectively. A transmitter coil spacer plate (not shown) is typically provided between each transmitter coil plate 214, 215 and the gradient coil plates 212. Portions of the coil 216 within each plate 214, 215 lie in a plane parallel to the pole faces 206a, 208a. The space between the upper and lower transmitter coil plates 214, 215 define an imaging volume 220 for receipt of a subject for an MRI procedure. The transmitter coil plate 214 and the gradient coil plate 212 are typically made of a flame retardant, insulative material, such as polyvinylchloride (PVC). The MRI System 200 is described in more detail, below. The magnet assembly is located within a shielded room (not shown), as is known in the art. The shielding of the room is referred to as a Faraday shield.

In use, the test fixture 100 of the present invention is deployed in the gap 220 between the pole faces 206a, 208a of the magnet assembly, as shown in FIG. 2. In a preferred embodiment, the test fixture 100 is stored in the gap 220 as well. For example, the fixture 100 may be stored within the upper transmitter coil plate 214, between the coil 216a of the upper portion of the transmitter coil 216 when the fixture is not in use, as discussed below.

Figure 3:
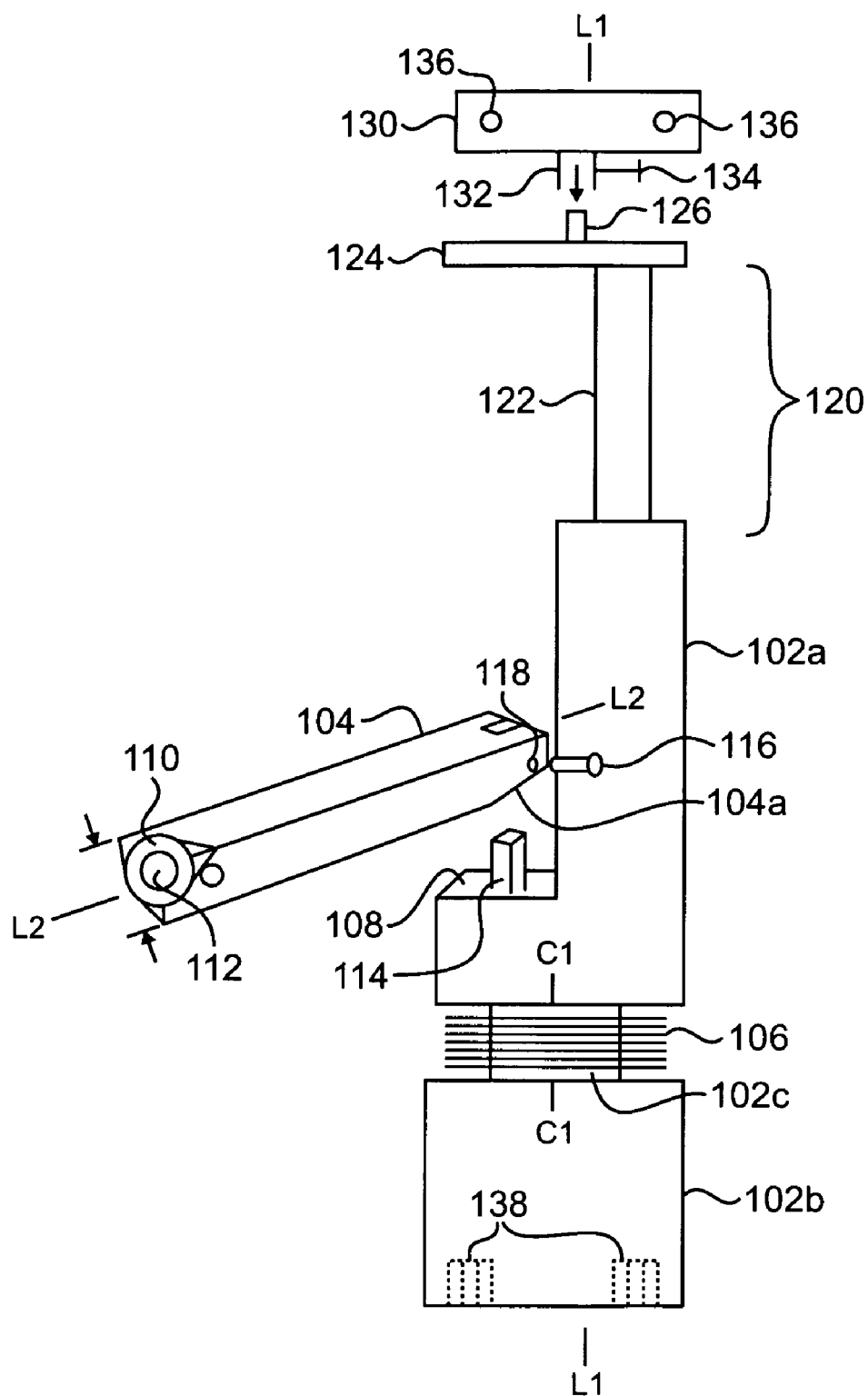
FIG. 3 is an enlarged view of the test fixture of FIG. 2, in a deployed position.

FIG. 3 is an enlarged view of the test fixture 100 of FIG. 2, in a deployed position. The fixture 100 has a longitudinal axis "L1". The arm 104 has a longitudinal axis "L2".

The body portion 102 may comprise an upper body portion 102a and a lower body portion 102b. An intermediate body portion 102c may be provided between the upper and lower body portions 102a, 102b. A pick up coil 106 is wound about the intermediate body portion 102c. In a preferred embodiment, the pickup coil 106 is used for detecting the X, Y and Z gradient magnet fields and the radio frequency signals emitted by the transmitter coil 26. The pick up coil 106 has a central axis "C1" parallel to the longitudinal axis L1 and the windings of the coil 106 are substantially perpendicular to the longitudinal axis L1. The pick up coil 106 may be 22 gauge wire with 300 turns, for example. The intermediate body portion 102c is preferably recessed with respect to the upper and lower body portions 102a, 102b. Preferably, the outer diameter of the coil 106 is about the same as the width of the fixture 100. The main body 102 may be rectangular, with a width of about 1.375 inches and a depth of about 0.75 inches, for example. The coil 106 may be oval and have a short outer diameter of about 0.75 inches and a long outer diameter of about 1.375 inches.

Preferably, the fixture 100 includes a telescoping section so that the length of the test fixture 100 may be adjusted as necessary for storage. In this implementation, a telescoping section 120 is included in the upper body portion 102a. The telescoping section 120 may comprise a longitudinal rectangular opening in the main body portion 102 and a rectangular member 122 tightly, but slideably, received within the opening. The opening and the member 122 received in the opening may be other shapes, such as round, as well.

The arm 104 supports a sample coil 110 wound around a container or sample cell containing a test substance capable of emitting a magnetic resonance ("MR") signal upon excitation. The sample coil preferably acts as both a transmitting coil to emit radio frequency signals for exciting the test substance and as a receiving coil for receiving the MR signal emitted by the test substance. Such a coil is hereinafter referred to as a "transceiver". The Larmor frequency of the magnetic field is thereby detected and the stability of the magnet may be monitored.

Figure 4:
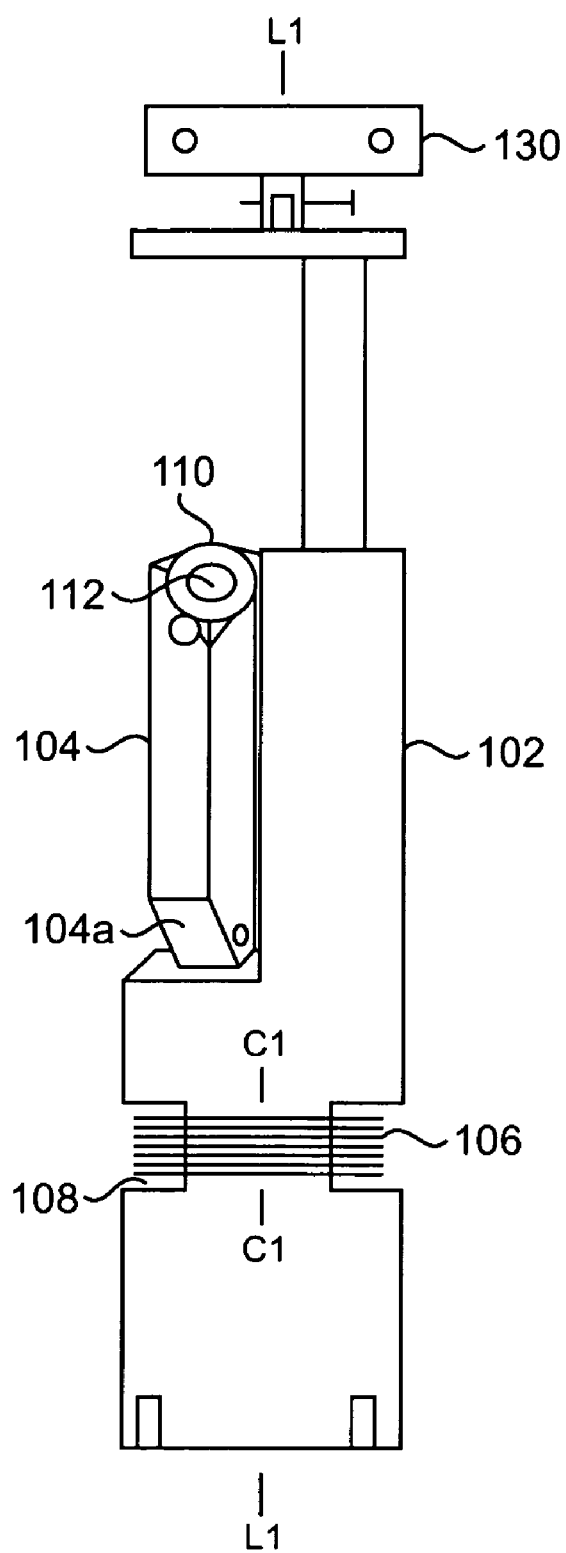
FIG. 4 shows a sample arm of the fixture of FIG. 2 in a first, undeployed position for storage when not in use.

In this implementation, the arm 104 has a first end pivotally connected to a shoulder portion 108 of the body portion 102a, so that it can be readily rotated between a first, undeployed position and a second deployed position. In the undeployed position, the longitudinal axis L2 of the arm is parallel to the longitudinal axis L1 of the fixture 100 for storage when not in use, as shown in FIG. 4. In the deployed position, the axis L2 is transverse to the axis L1. Preferably, the axis L2 is perpendicular to the axis L1. The first end of the arm 104 preferably has a tapered portion 104a, facilitating rotation of the arm with respect to the shoulder portion 108. A second end of the arm is distanced from the lower body portion 102b. The sample coil 110 is supported by the arm proximate the second end of the arm 104. The sample coil 110 may be at or near the second end. The pivotal connection may be provided by connecting the sample arm 104 to a post 114 on the shoulder portion 108 by a screw 116 of non-ferromagnetic material, such as nylon. The arm 104 may have a first opening 118, which may be a tapped hole, and the protrusion 114 may have a through hole 120. The first opening 118 of the arm is aligned with the through hole 120 of the post 114 and the screw 116 is inserted through the aligned holes.

Figure 5:
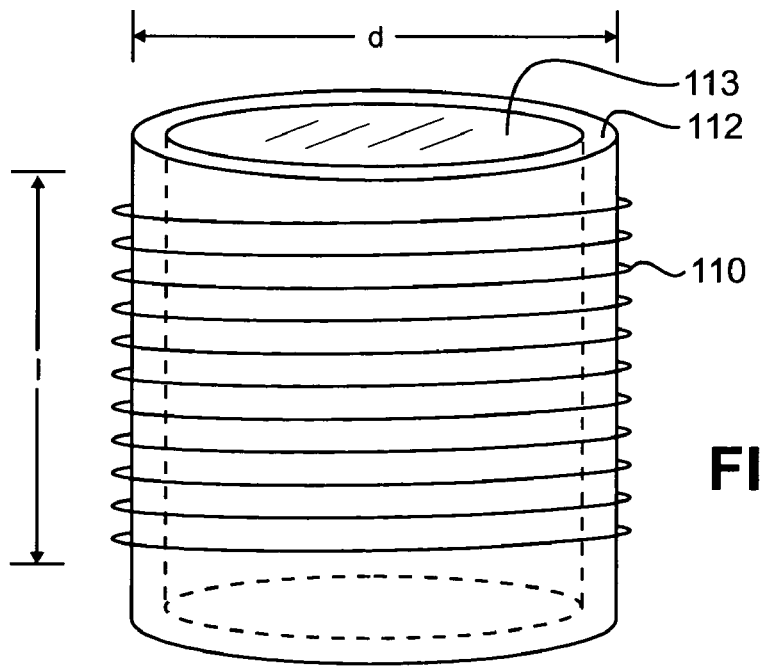
FIG. 5 is a side view of the sample coil and the sample cell supported by the sample arm, in an upright position.

FIG. 5 is a side view of the sample coil 110 and the sample cell 112 in an upright position. The coil 110 is tightly wound around the sample cell 112. The sample cell 112 is typically a glass or PVC container, such as a vial, filled with a suitable test substance, referred to as a phantom material 113. The phantom 113 emits a strong MR signal upon excitation, preferably at the Larmor frequency of hydrogen, as is known in the art. The phantom material may be petroleum jelly, such as Vaseline (R), water, salt water, or nickel chloride, for example. The sample coil 110 may be 22 gauge wire, for example. The number of turns of the coil may vary depending on the magnetic field strength. Fourteen (14) turns have been found to be acceptable at 0.6 Tesla, for example. The outer diameter "d" of the coil 110 may be about 9/16 inch. The length "1" of the coil may be about 5/8 inch. A tuning capacitor "C" is preferably provided in series with the coil 110, as shown in FIG. 3.

The bottom end of the lower body portion 102b includes electrical connectors 138, shown in phantom in FIG. 3. The electrical connectors 138 may be two sockets of a RCA Jack, for example, electrically connected to the pick up coil 106 and to the sample coil 110, respectively. The sockets 138 are connected to corresponding connectors 228, such as pin connectors of the Jack, in a recess 230 in the second transmitter coil plate 215 when the test fixture 100 is deployed. The electrical connectors are connected to cables (not shown) that extend out of the second transmitting coil plate 228, to a computer, which may be the computer 14 of the MRI system 10 of FIG. 1. Care should be taken in routing the cables through the transmitting coil plate 228 and to the computer 14, to avoid coupling with the transmitting coil 216b.

FIG. 6 is a side perspective view of an implementation of the fixture 100 in an undeployed position. The upper body portion 102a and the lower body portion 102b are formed of a single rectangular piece of plastic material, such as PVC, milled to a desired shape. A recessed section 102c is milled at an appropriate location, between the upper body portion 102a and the lower body portion 102b. An opening 103 is defined in the upper body portion, for receiving the member 122. Openings are also formed in the lower body portion 102b for the sockets 138. Grooves 111 are provided along opposite sides of the lower body portion 102 to accommodate wires 106b, 110a extending from the pick up coil 106 and the sample coil 110, respectively, to the sockets 138. The upper body portion 102a also includes a groove 113 for the wire 110a. The arm 104 is shown in its undeployed position, parallel to the longitudinal axis L1 of the fixture 100. The arm is also a piece of PVC or other such material milled to shape. A groove 115 to accommodate the wire 110a is formed in the arm 104, as well. The sample cell 112 and the sample coil 110 are supported within a recess or cavity 104a formed in the arm 104.

An additional degree of flexibility may be added to the fixture 100 by providing separate upper and lower body portions. The intermediate body portion may be integral with one of the body portions and a recess may be formed in the other to receive the intermediate body portion. A locking mechanism may be provided in the recess to lock the intermediate body portion in a selected position, to further adjust the length of the fixture and the location of the coil 106.

Figure 7:
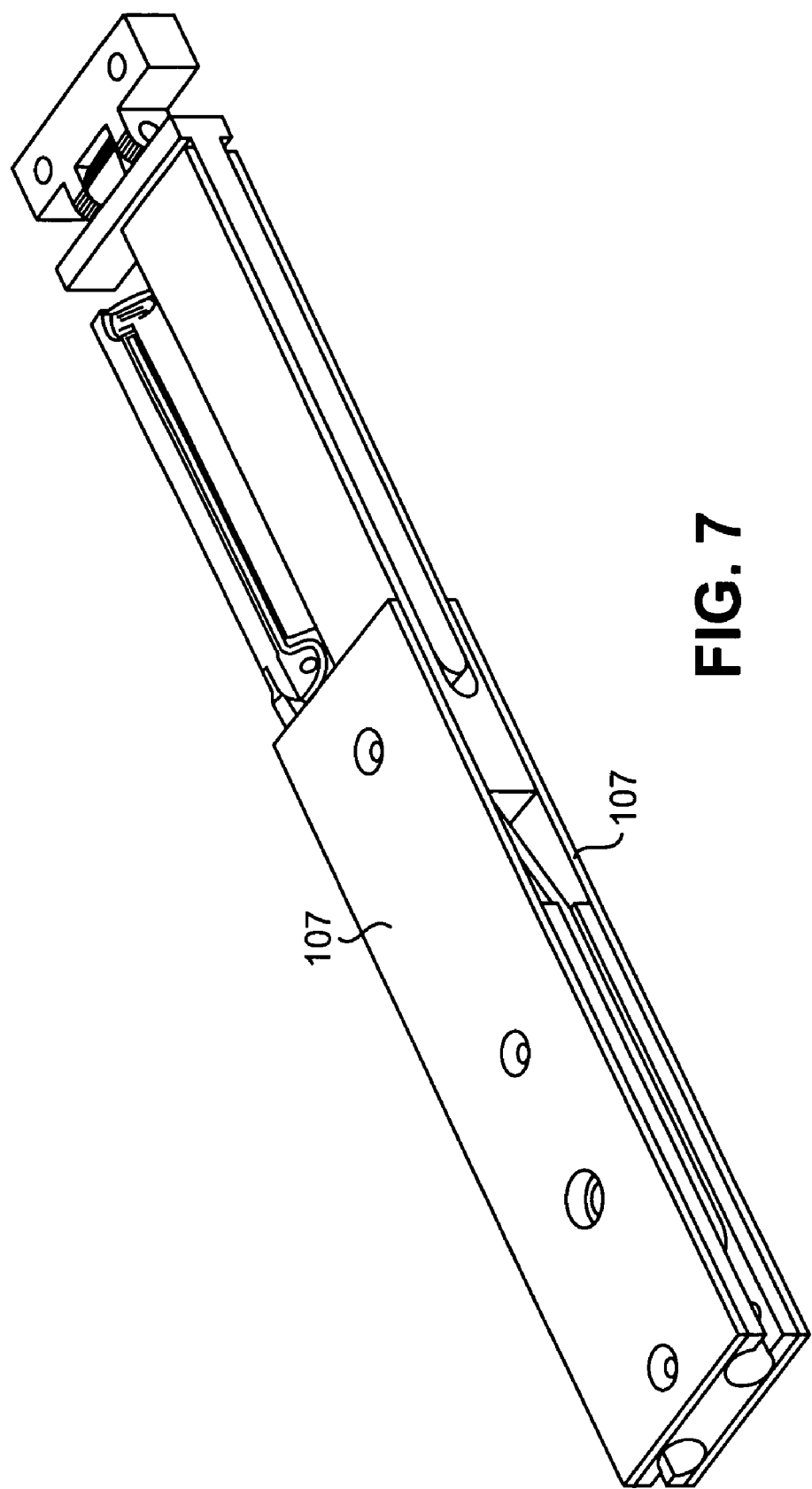
FIG. 7 is a side perspective view of a preferred implementation of the test fixture of FIG. 6.

FIG. 7 is a side perspective view of the implementation of FIG. 6, showing a pair of parallel plates 107, which are preferably provided over the lower body portion 102b, the pickup coil 106 and the lower portion of the upper body portion 102a, to cover the coil 106 and the wires 106a, 110a. The parallel plates 107 may be secured to the upper and lower body portions by non ferromagnetic screws, such as nylon screws. Holes 109 for receiving such screws are shown in FIGS. 6 and 7.

Figure 8:
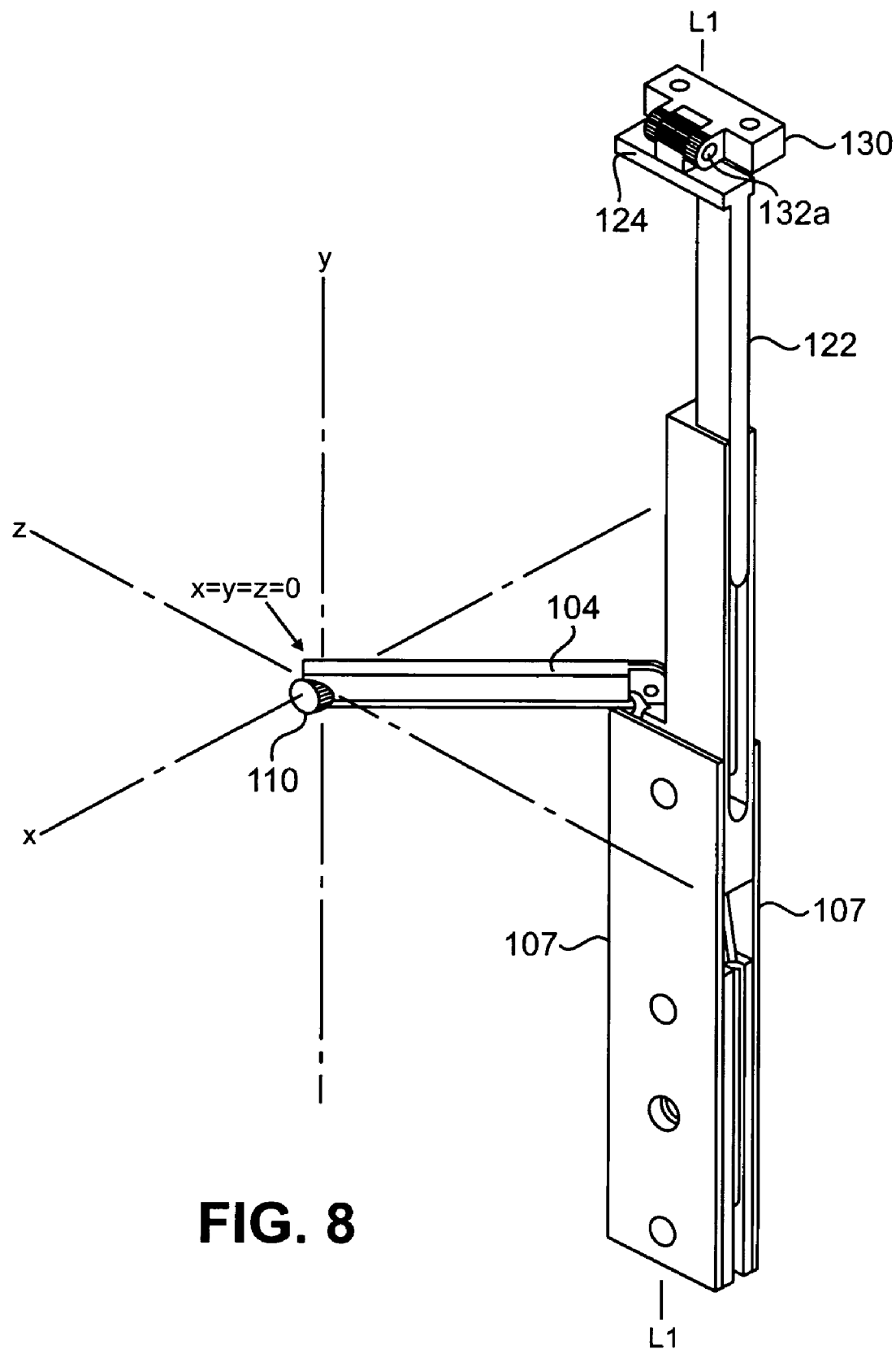
FIG. 8 is a perspective view of the implementation of the test fixture of FIG. 6, in a deployed position.

Returning to FIG. 3, one end of the rectangular member 122 may be connected to an upper plate 124, that is connected to a pivot for being mounted to the upper transmitter plate 214. For example, the upper plate 124 may have a post 126 with a through hole. The pivot may comprise a plate 130 for connection to the transmitter plate. A pair of parallel posts 132 extend from the plate 130. Each post 132 has a through hole 132a that may be tapped. The through hole 132a is shown in FIG. 8, which is a perspective view of the fixture 100 in a deployed position. The hole in the first post 126 is aligned with the pair of holes in the pair of posts 132 and a screw 134 of non-ferromagnetic material, such as nylon, is inserted through the aligned holes. The first post rotates about the axis of the screw 134. The plate 124 may be integral with the member 122, as shown in the implementation of FIGS. 6-8.

In FIG. 8, the telescoping section 122 is extended and the arm 104 is perpendicular to the longitudinal axis L1 of the fixture. The plate 130 is rotated about the pivot (screw 134) so that it could be connected to the transmitter plate 214, as discussed further below. The X, Y and Z axes of the imaging volume 220 are also indicated. When the arm 104 is deployed, the sample coil 110 is preferably positioned at the center of the imaging volume, where X=Y=Z=0, as discussed further below. In addition, when the arm 104 is deployed, an axis through the center of the sample coil 110 is preferably perpendicular to the direction of the main magnetic field and is preferably aligned with the X axis, as shown in FIG. 8.

Figure 9:
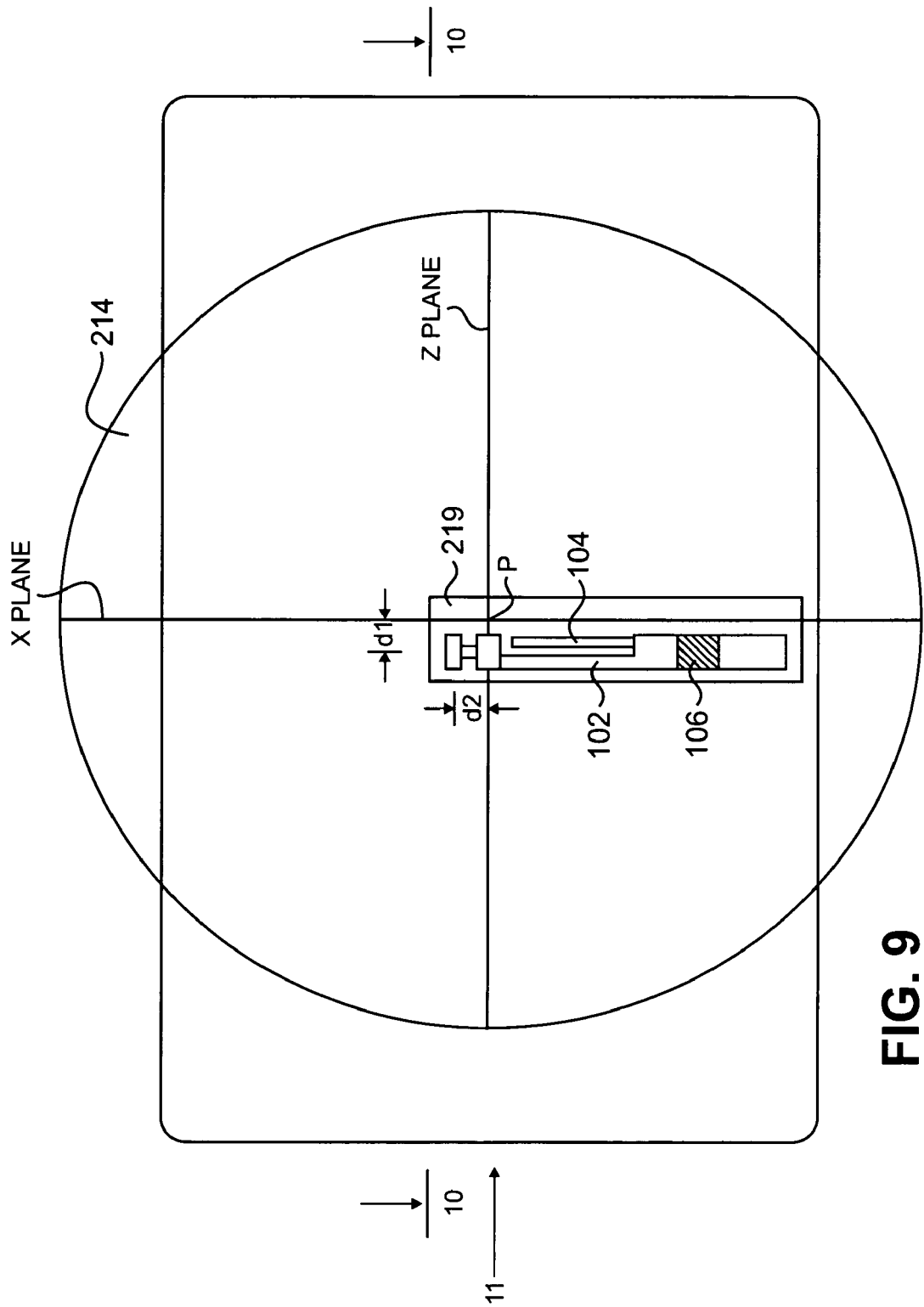
FIG. 9 is a view of the face of a transmitter coil plate of the top pole of an Open MRI System with the test fixture in its undeployed, stored position within the transmitter coil plate.

FIG. 9 is a view of the face of the transmitter coil plate 214 of the top pole 208, with the test fixture 100 in its undeployed, stored position within the transmitter coil plate. The fixture is preferably stored within a rectangular chamber 219. The telescoping section 120 is collapsed and the arm 104 is parallel to the main body portion 102. The Y and Z planes of the imaging volume 220 are also indicated, coming out of the page.

Figure 10:
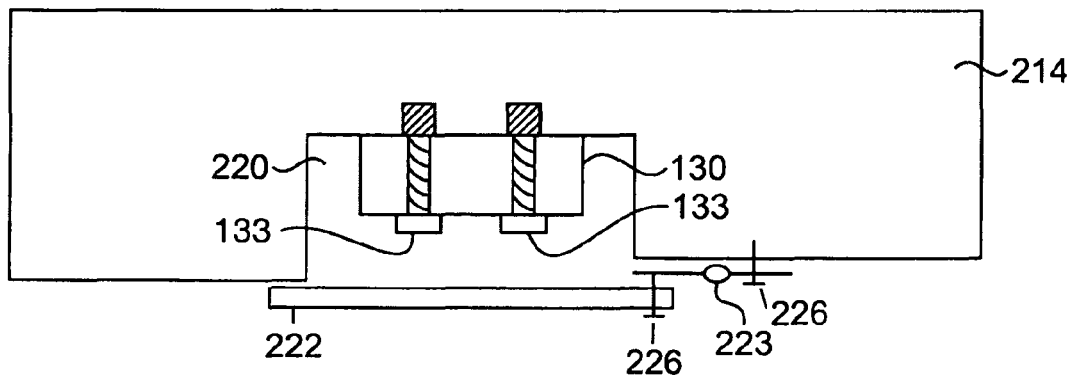
FIG. 10 is a cross-sectional view of the upper transmitter coil plate along line 10-10 in FIG. 9, showing the chamber.

The rectangular chamber 219 may be formed in the transmitter coil plate 214 by removing a section of the plate material by milling or routing, for example. FIG. 10 is a cross-sectional view of the upper transmitter coil plate 214 along line 10-10 in FIG. 9, showing the chamber 219. The block 130 is shown connected to the transmitter coil plate 214 by the screws 133. A door 222, preferably of the same material as the plate 214, is attached to the plate 214 through a hinge 223. The door 222 may be connected to the hinge 223 and the hinge may be connected to the plate 214 by screws of non-ferromagnetic material, such as nylon screws 226, for example. The door 222 may be closed when the fixture is not deployed.

If the transmitter coil 216 is not provided in a transmitter coil plate, the test fixture 100 may be stored in the gradient coil plate 212, if there is room. Alternatively, a plate of insulative material may be provided just to store the test fixture 100.

To deploy the test fixture 100 in accordance with the preferred embodiment, the door 222 is opened and the test fixture 100 is rotated 90° about the axis of the pivot (of the screw 134) to a position perpendicular to the top transmitter coil plate 214. The telescoping section 120 is extended so that the electrical connections 138 in the test fixture 100 mate with the electrical connections 228 in the lower transmitter coil plate 215 and the sample arm 104 is rotated 90° about the pivot point to a position perpendicular to the main body portion 120.

Figure 11:
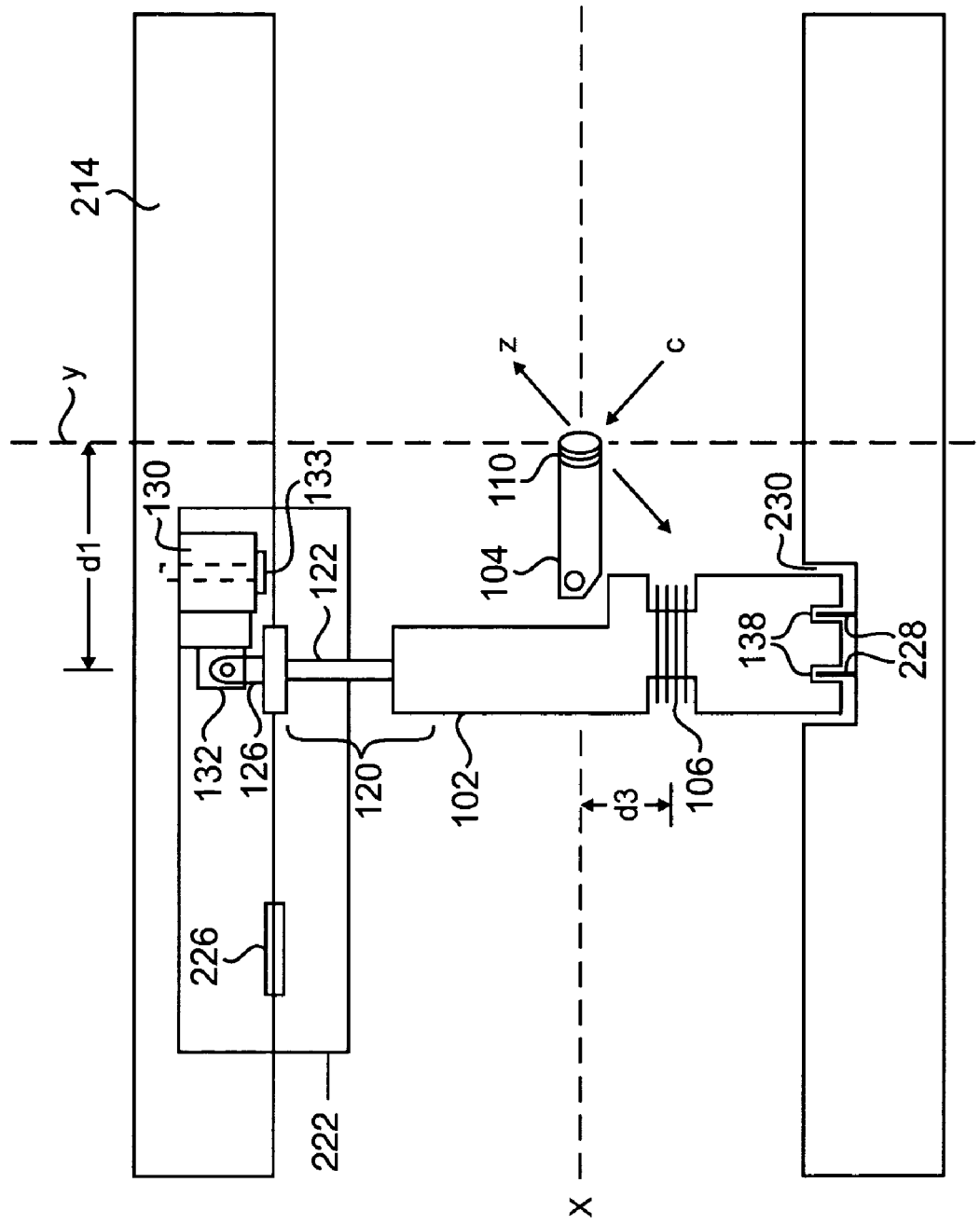
FIG. 11 is a partial cross-sectional view of the upper plate and the lower plate along arrow 11 of FIG. 9 (which is along the X axis), showing the test fixture in a deployed position.

FIG. 11 is a partial cross-sectional view of the upper plate 214 and the lower plate 215 along arrow 11 of FIG. 9 (which is along the X axis) showing the test fixture 100 in a deployed position. The X and Y planes are indicated, perpendicular to the page in FIG. 11. The distances d1 and d3 are also shown. The ferromagnetic elements 202 are not shown in this view, for ease of illustration.

As is known in the art, the X, Y and Z gradient magnetic fields have a zero value along the X, Y and Z planes, respectively, and at the center C of the imaging volume 221, where the X, Y and Z planes intersect. The test fixture 100 is therefore mounted to the upper transmitter coil plate 214 in a location displaced a distance "d1" from the X plane to displace the pick up coil 106 from the X plane when deployed, as shown in FIG. 9. The test fixture 100 is also mounted a distance "d2" from the Z plane to displace the test fixture from the Z plane when deployed. The coil 106 is mounted to the test fixture 100 a distance "d3" below the midpoint of the fixture when it is deployed in the imaging volume 220 so that it does not lie along the Y plane, as shown in FIG. 11. If the pickup coil 106 is too close to the center "C" of the imaging volume 220, the strength of the gradient field may not be sufficient for analysis. If the pick up coil 106 is too far from the center C, distortions in the gradient fields could interfere with the analysis. In this system, d1=d2=d3=about 3.5 inches. While preferred for simplicity of design, it is not necessary for d1, d2 and d3 to be equal.

As mentioned above, when the sample arm 104 is rotated, the sample coil 110 is preferably placed at the center "C" of the imaging volume 220. The length of the sample arm 104 is sufficient to bring the sample coil 110 to the center C of the imaging volume, at the intersection of the X, Y and Z planes. Where the sample coil 110 is positioned at the end of the arm 104 and d1=d2=about 3.5 inches, the length of the sample arm 104 is about 4.9 inches.

The typical MRI System 10 will now be discussed in more detail, along with a discussion of the connection of the test fixture 100 of the present invention to the typical MRI system 10. As briefly discussed above, FIG. 1 is a schematic representation of an exemplary MRI system 10 including a computer 14, an image display system 16, a nuclear magnetic resonance sequence and timing controller ("NMR controller") 18 and a digital data processor 20. The system also includes a gradient controller 22, that controls the gradient coils Gx,t, Gy, Gz, and a radio frequency transmitter subsystem ("RF subsystem") 24 including a transmitter coil 26 coupled to an amplifier 28.

A receiver coil 30 is coupled to the digital data processor 20 through a pre-amplifier 32, a variable amplifier 34, a frequency divider or frequency down converter ("FDC") 36 and an analog-to-digital converting array ("A/D array") 38. The digital data processor 20 is typically coupled to the A/D array 38 through a data bus (not shown). While separate transmitter and receiver coils 26, 30 are shown, a single coil can be used to both transmit a radio frequency pulse and to receive MR signals, as is known in the art.

The MRI system 10 includes an imaging volume defined within a magnet 50. The transmitter coil 26 and gradient coils Gx,t, Gy, Gz are within the gap region 221 between the poles 206, 208. The amplifier 32 is also within the gap region 221. The patient 52 is shown resting on a bed 54 within the imaging volume 220 of the magnet 50. The receiver coil 30 is positioned proximate to the patient, within the imaging volume 220, as well. As discussed above, electromagnetic coils (not shown) for generating an electromagnetic field and shim coils (also not shown), are provided adjacent to the poles 206, 208 of the magnet 50, as is known in the art.

The computer 14 is a real time computer with submicrosecond timing precision. The computer 14 controls the overall operation of the MRI System 10. The computer 14 has outputs connected to inputs of the image display system 16, NMR controller 18, digital data processor 20, gradient controller 22 and RF subsystem 24. The computer 14 also has inputs connected to outputs of the image display system 16, NMR controller 18 and digital data processor 20. Predetermined pulse sequences are stored in the computer 14. The computer 14 provides the pulse sequence selected by the operator to the NMR controller 18 for execution.

The NMR controller 18 is a microprocessor based timing controller or other programmable device that stores the pulse sequence provided by the computer 14. A clock (not shown) in the NMR controller 18 synchronizes the entire MRI System 10. The NMR controller 18 has outputs connected to inputs of the gradient controller 22 and RF subsystem 24. The NMR controller 18 also has outputs connected to inputs of the FDC 36 and A/D array 38. The NMR controller 18 has inputs connected to outputs of the gradient controller 22 and RF subsystem 24. The NMR controller 18 may be part of the computer 14.

The gradient controller 22 is a microprocessor, such as a digital signal processor (DSP). The gradient controller 22 is connected to the gradient coils Gx,t, Gy, Gz through digital-analog-converters and amplifiers (neither of which are shown). The gradient coils Gx,t, Gy, Gz generate orthogonal linear magnetic fields within the imaging volume along the X, Y and Z axes, respectively, under the control of the gradient controller 22. The gradient controller includes a waveform generator (not shown) containing a generic waveform stored in digital form and a phase encoding waveform. The magnitudes and directions of the gradient fields to be generated by each coil Gx,t, Gy, Gz during a particular pulse sequence are provided by the computer 14 to the gradient controller 22, which stores the information. The NMR controller 18 controls the timing of the operation of the gradient controller 22. In response to a pulse or pulses from the NMR controller 18, the gradient controller 22 causes the output of a particular waveform or waveforms for a desired pulse sequence to each of the gradient coils Gx,t, Gy, Gz, as is known in the art.

When instructed by the computer 14, the NMR controller 18 executes the pulse sequence provided by the computer 14 by providing a synchronization pulse for indicating the start of a scanning procedure and timing pulses for controlling the operation of the various subsystems, to the A/D array 38, RF subsystem 24 and the gradient controller 22. For example, the NMR controller 18 provides a series of pulses to the A/D array 38 indicating when the A/D array 38 should sample the signal provided by the frequency down converter 36. The NMR controller 18 similarly provides a series of pulses to the RF subsystem 24 for initiating the injection of radio-frequency pulses of particular values, as determined by the pulse sequence, into the imaging volume 220. The NMR controller 18 also controls operation of the gradient controller 22, identifying when the gradient fields should be turned on and off. In this way, the NMR controller 18 and the computer 14 control the execution of a pulse sequence and the implementation of the MR scanning procedure.

As discussed above, the magnet assembly may be in an open configuration, as described in the U.S. Pat. No. 6,208,145 B1, U.S. Pat. No. 6,201,394 B1, U.S. Pat. Nos. 6,075,364 and 6,023,165, for example, which are assigned to the assignee of the present invention and incorporated by reference herein, in their entireties. Examples of commercially available Open MRI Systems are the Quad 12000™ and the Indomitable™ Open MRI Systems, from FONAR Corporation, Melville, N.Y. The magnet assembly need not be in an open configuration, however. The present invention may be used with any type of MRI system.

Figure 1:
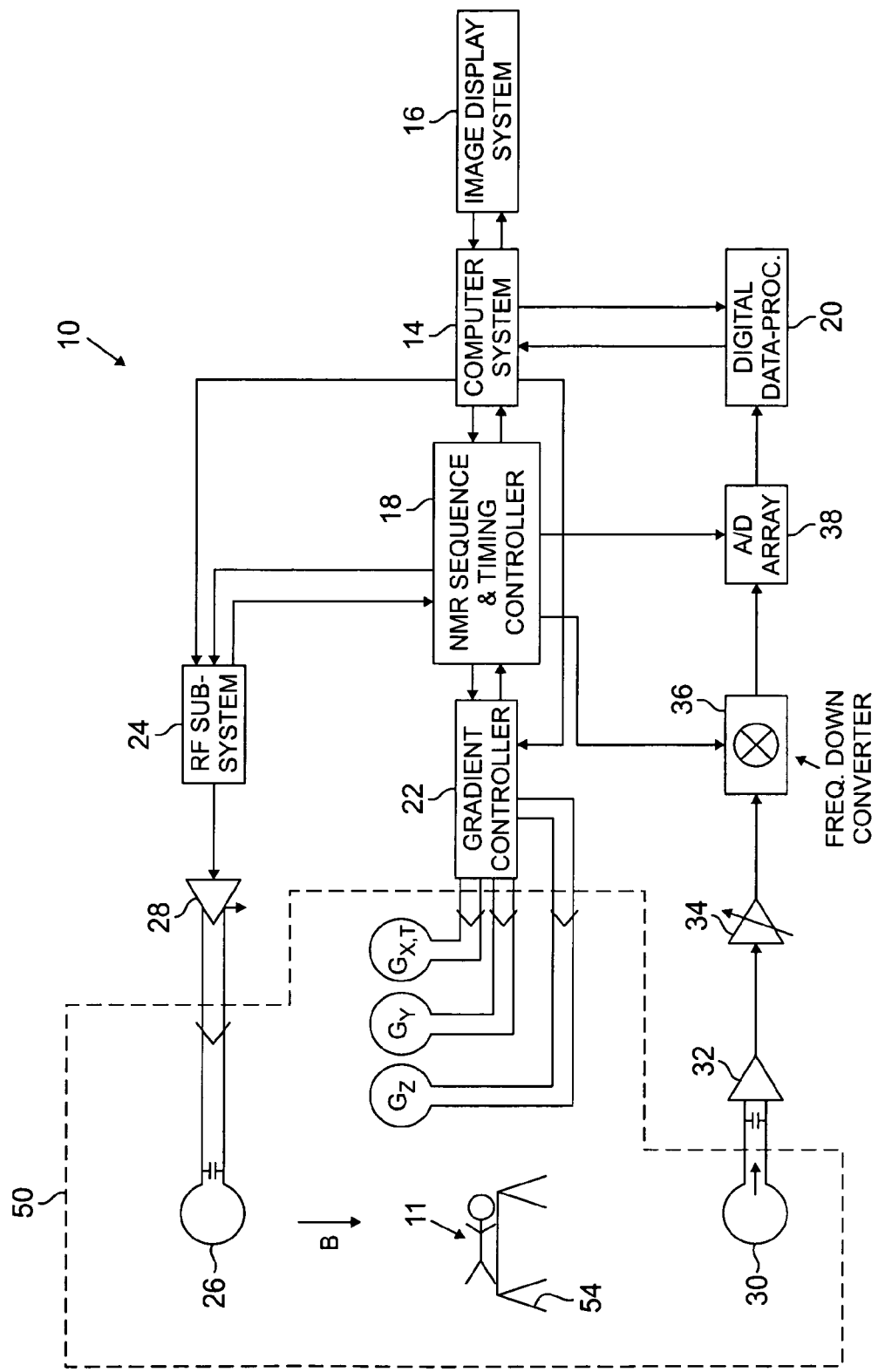
FIG. 1 is a schematic representation of a typical MRI System.
Figure 12:
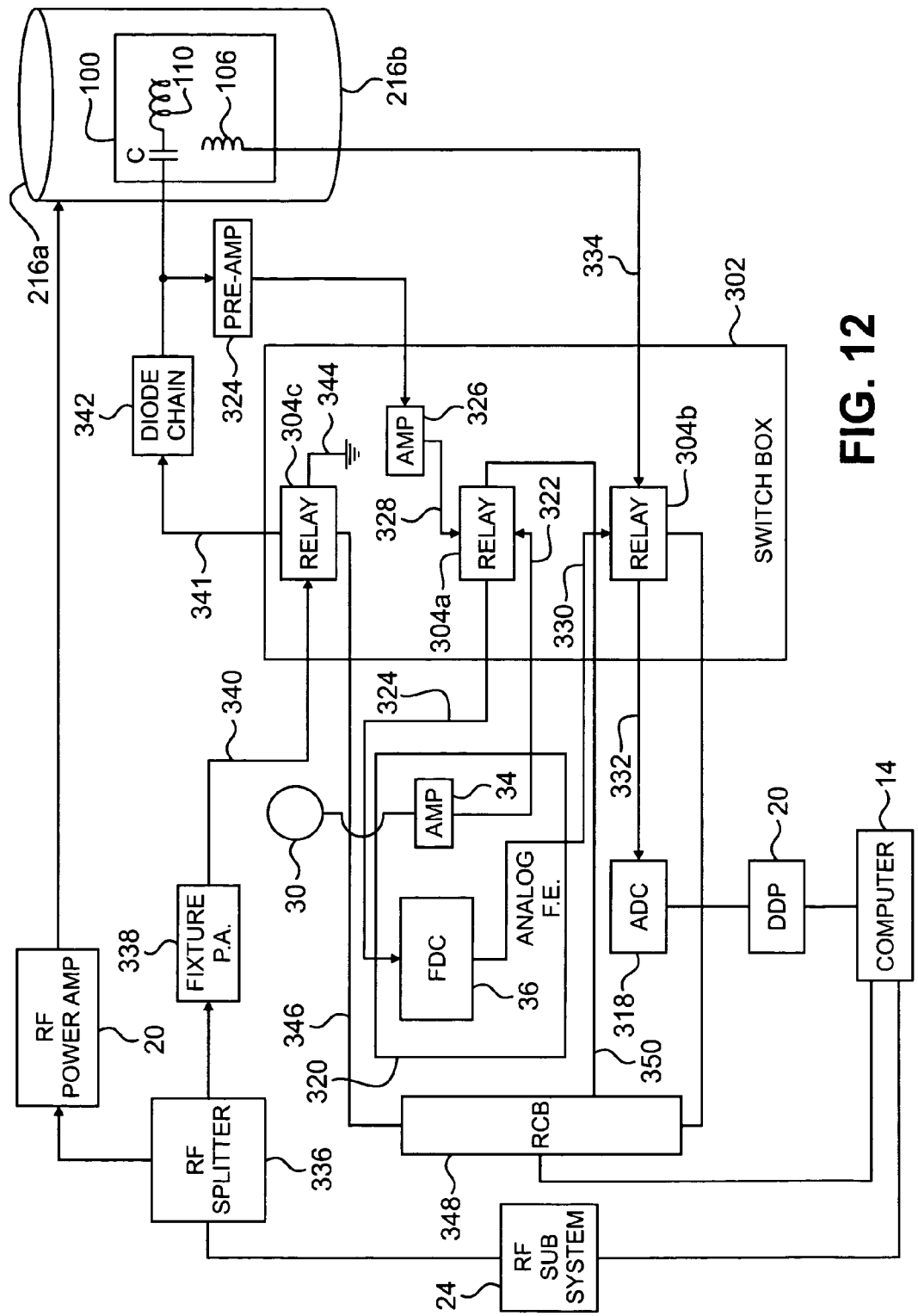
FIG. 12 is a schematic diagram of the interface of the test fixture of the present invention with the MRI System of FIG. 1.

FIG. 12 is a schematic diagram of a preferred interface 300 for the test fixture 100 of the present invention with the MRI System 10 of FIG. 1. The fixture 100 is indicated schematically by a block 100, which contains a block 106, representative of the pick up coil 106, and a block 110, representative of the sample coil.

Figure 13:
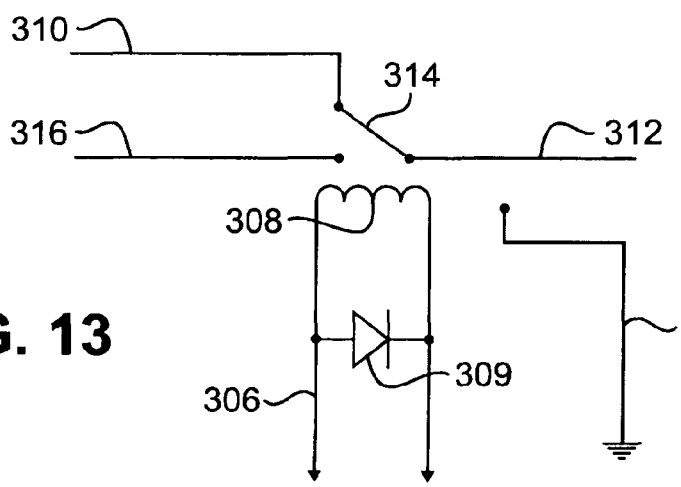
FIG. 13 is a schematic diagram of each relay.

The test fixture 100 is electrically connected to the MRI System 10 through a switch box 302. The switch box 302 comprises three relays 304a, 304b, 304c. FIG. 13 is a schematic diagram of each relay 304. Each relay 304 comprises a control line 306 for energizing a solenoid 308. First, second and third lines 310, 316 and 312 are provided. The relay 304 normally connects the first line 310 to the third line 312. When the solenoid 308 is activated by the control line 306, an arm 314 is attracted toward the solenoid 308, connecting the second line 316 to the third line 312. A line 317 is also provided for grounding. The relays may be a COTO 2610-05-321 relay available from Coto Technology, Providence, R.I., for example, wherein the relay coil voltage is 5 volts, the coil 308 resistance is 230 Ohms, there is a coaxial shield and there is a diode 309 across the central line 306, as shown in FIG. 13. While relays are preferred, other types of switches or other selective connections may be used.

Returning to FIG. 12, the A/D converting array 38 of the MRI System 10, discussed above with respect to FIG. 1, is connected to the Digital Data Processor ("DPP") 20, which is in turn connected to the computer 14. The variable amplifier 34 and FDC 36 of the MRI System 10, also discussed above with respect to FIG. 1 and shown in FIG. 8, are referred to as the Analog Front End 320.

In normal operation, the variable amplifier 34 is connected to the FDC 36 through the first relay 304a. The variable amplifier 34 provides one input to the relay 304a, along a first input line 322. The output of the relay is provided to the FDC 36 along line 324. A second input to the first relay 304a is provided from the sample coil 110, through a pre-amplifier 324 and an amplifier 326, along line 328. The amplifier 326 may be within the switch box 30, as shown, or it may be outside of the switchbox.

The FDC 36 of the Analog Front End 320 is connected to the A/D converting array 38 through the second relay 304b, in normal operation. One input is provided from the FDC 36 to the relay 304b along a first input line 330. The output of the relay 304b is connected to the A/D converting array 38 along line 332. A second input is provided to the second relay 304b by the gradient pick up coil 106 along a second input line 334.

A radio frequency (RF) splitter 336 provides radio frequency signals to the amplifier 28 (see also FIG. 1) connected to the transmitter coil 26 of the MRI System 10 and to the sample coil 110 of the test fixture 100, under the control of the Computer 14 through the NMR Sequence and Timing Controller (shown in FIG. 1) through the RF subsystem 24. The RF splitter 336 is connected to a power amplifier 338. The power amplifier 338 is connected to the third relay 304c along a first input line 340. An output line 344 is shown connected to ground.

As discussed above, the sample coil 110 is also connected to the first relay 304a through the preamplifier 324 and the amplifier 326, along the second input line 328.

The output line 344 of the third relay 304c is connected to ground during normal operation of the MRI system (during scanning) in order to ground noise that may be introduced into the shielded room surrounding the MRI magnet assembly.

The first, second and third relays 304a, 304b, 304c are controlled by the computer 14 though a relay control board ("RCB") 348. The control line 350 is connected to the first relay 304a, the control line 352 is connected to the second relay 304b and the control line 346 is connected to the third relay 304c.

During normal operation of the MRI System 10, the control line 350 to the first relay 304a is off, so that the relay 304a is in its normal position, connecting the input line 322 to the output line 324. The receiver coil 30 of the MRI System 10 is thereby connected to the FDC 36, through the pre-amplifier 32 (shown in FIG. 1) and the variable amplifier 34. The control line 352 to the second relay 304b is also off, so that the relay 304b is in its normal position connecting the input line 330 to the output line 332. The Analog Front End 320 is thereby connected to the A/D converting array 38 of the MRI System 10. The control line 346 to the third relay 304c is also off and the relay 304c is in its normal position, connecting the line 341 to the grounded output line 344.

The relays 304a, 304b, 304c are controlled by the computer 14 to connect the test fixture 100 of the present invention to the Analog Front End and the A/D converting array 38 of the MRI System 10 as appropriate during use of the test fixture.

To conduct a particular test procedure with the test fixture of the present invention, the test fixture is deployed and the relays 304a, 304b, 304c are selectively activated. To detect the X, Y and Z gradients with the pickup coil 106, the control line 352 to the second relay 304b is turned on, causing the second input 334 of the relay 304b to be connected to the output line 332. The pick up coil 106 is thereby connected to the A/D converting array 38 of the MRI System 10. A predetermined test pulse sequence is executed by the MRI System 10. The X, Y and Z gradient magnetic fields generated in response to the pulse sequence induce analog voltage signals in the pick up coil 106, which are processed by the A/D converting array 38 and the computer 14 of the MRI System 10. The voltage waveforms of the X, Y and Z gradient magnetic fields are compared to expected waveforms, preferably by software. The comparison and display may be performed on-site by the computer 14 and the image display system 16 of the MRI System 10, or it may be performed and displayed by a computer at a field service facility. It is convenient to display the actual test results, the expected test results and their deviation for analysis by a field service technician, on-site or at a field service facility. The voltage waveforms may be integrated to yield a value that can be compared to an expected value, as well. Software for such analysis, comparison and display of the test results are well known in the art. The data may be readily transmitted by the computer 14 by modem across telephone lines, through the Internet, or by any other electronic or electromagnetic means, to a field service facility.

The pick up coil 106 can also be used to detect the radio frequency pulses emitted by the transmitter antenna 26 to evaluate the RF subsystem 24. A test pulse sequence, which may be the same sequence as used in the test of the gradient magnetic fields, is implemented by the MRI System 10. The pulse sequence causes the transmitter coil 26 to emit radio frequency pulses, which also induce analog voltage signals in the pick up coil 106. The signals received by the pick up coil 106 are provided to the A/D converting array 38. The voltage waveform constructed from the detected signals is compared by software to the expected waveform of the radio frequency pulses by suitable software, as above.

The short-term and long-term stability of the magnet of the MRI System 10 may be analyzed with the sample coil 110. As mentioned above, the sample coil 110 is preferably a transceiver that emits radio frequency pulses to excite the phantom sample 112 and detects MR signals emitted by the sample 112. The gradient magnetic fields need not be generated during this test. The control line 346 of the third relay 304c is turned on to cause the second input line 340 to be connected to the output line 341. The RF subsystem 24, is thereby connected to the sample coil 110 through the RF splitter 336, fixture power amplifier 338, the third relay 304c, and the diode chain 342, so that the sample coil 110 can transmit radio frequency pulses to the sample 112. The control line 350 to the first relay 304a is also on, disconnecting the receiver coil 30 of the MRI system 10 from the FDC 36 and connecting the sample coil 110 to the FDC 36. Voltage signals induced in the sample coil 110 by MR signals emitted by the sample 112 are amplified by the preamplifier 324 and the MRI amplifier 326, and provided to the FDC 36 for signal processing and analysis. The reverse bias of the diode chain 342 prevents the received signals from being provided to the third relay 304c instead of to the pre-amplifier 324, preventing loading of the MR signal by the transmitter coil 26.

The MR signal is detected by the sample coil 106 and monitored for a period of time. If the magnetic field of the magnet changes, the Larmor frequency of the emitted MR signals will change. The test can be run for about 1 hour to detect short term instabilities, due to transients in the power supply, for example. The test can be run for 5-6 hours to detect long term instabilities, such as thermal drift caused by the air conditioner or chiller. While the sample coil 110 is preferably a transceiver, two coils may be provided, one being a transmitter and the other a receiver. Both may be wound around the test sample.

Figure 14:
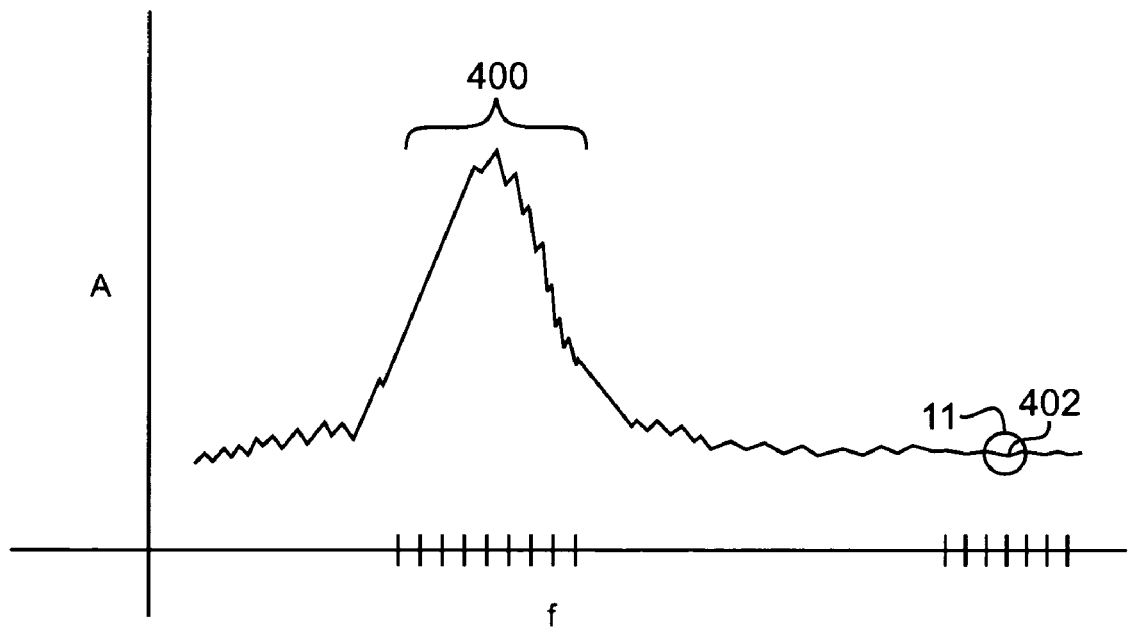
FIG. 14 is a graph of the amplitude of an MR signal versus frequency.
Figure 15:
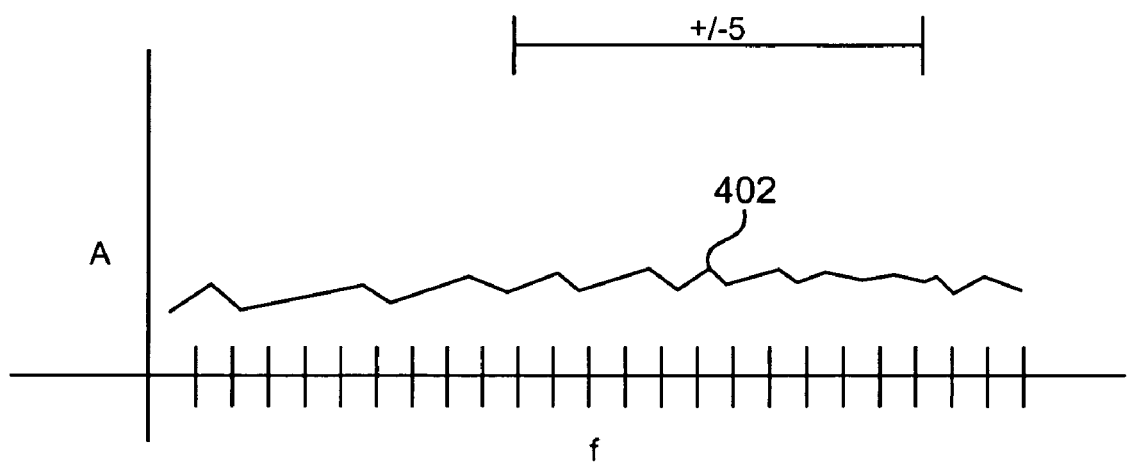
FIG. 15 is an enlarged portion of the graph of FIG. 15.

The present invention also provides standardized, reproducible testing procedures. This is particularly useful for detecting changes in signal-to-noise ratio ("S/N") over time. In a preferred method for detecting the S/N ratio, a pulse sequence for generating a slice select gradient, where all the spins in the sample are within a narrow frequency band, is executed. A Fourier transform of the signals detected by the sample coil from the test sample yields a single peak 400, as shown in FIG. 14. The amplitudes of the eleven frequency components +/−5 components around the peak 400 (including the peak) of the signal are averaged to be used as the signal value. One frequency component is nominally 50 Hz, for example. Another region 402 of the signal sufficiently displaced from the peak to be essentially noise (256 frequency components, for example) is identified and the amplitudes of 11 frequency components +/−5 components around a selected control frequency component within the region 402 (including the selected control frequency component) are averaged to yield a noise value. FIG. 15 is an expanded view of the circled portion 11 of FIG. 14. The signal value is divided by the noise value to yield the S/N ratio. The S/N ratio over several days may be compared. Drift in the S/N ratio may be indicative of a problem in a component of the MRI System or the presence of a new source of external noise.

Alternatively, the amplitude of a signal with the time domain pulse sequence on, representing the signal value, and with the pulse sequence off, representing the noise value, may be used to determine the S/N ratio.

The computer 14 controlling the MRI System 10 is preferably accessed by off-site field service personnel through a modem or the Internet, for example, to initiate the test procedures and to evaluate the results after the test fixture 100 is deployed by local personnel. On-site personnel are only needed to deploy the test fixture 100 in this embodiment of the invention. However, the test procedure may be initiated on-site and the test evaluated on-site, as well.

The test fixture 10 of the present invention may be readily retrofit into an Open MRI System by replacing the transmitter coil plates 214, 216 with one transmitter coil plate including a chamber 219 for storing the test fixture 100 and another plate including electrical connectors for connection to the test fixture between the rectangular transmitter coils 216a, 216b.

Other types of detecting coils or probes may be provided instead of either one or both of the gradient pick up coil 106 and the sample coil 110, or along with the pick up and sample coils. For example, a gauss meter may be provided to detect the magnetic field strength. An integrator coil may be provided to monitor changes in magnetic field strength. Use of such other coils or probes may require different positioning within the imaging volume 220, as would be apparent to one of ordinary skill in the art. While both the gradient pick up coil 106 and the sample coil 110 are preferably provided on the same test fixture 100, either coil may be used alone on the test fixture 100, in accordance with the present invention, as well.

The test fixture 100 of the present invention may also be used in other MRI systems, as well. For example, the MRI assembly may be an upright assembly for imaging a patient in a standing position, as disclosed in U.S. Pat. No. 6,075,364, assigned to the assignee of the present invention and incorporated by reference herein, in its entirety, for example. The poles of the magnet assembly create a magnetic field extending across the imaging volume in a horizontal orientation, instead of a vertical orientation, as in the MRI assembly 200 of FIG. 2. The patient is situated within the imaging volume between the poles and associated hardware. A gradient field coil plate and a transmitter coil plate may be connected to the poles, in the same manner as described above. The test fixture 100 may be stored in the transmitter coil plate, if present, or otherwise connected between the poles for testing.

The test fixture of the present invention may also be used in a magnet assembly comprising a C-shaped ferromagnetic frame. The frame includes ferromagnetic legs that extend towards each other, terminating in respective pole surfaces defining a gap therebetween for receiving a subject of an MRI procedure. Gradient coil plates and transmitting coil plates may be connected to the poles, as above. The test fixture may be connected to and stored within the transmitter coil plates, if present, or be otherwise connected between the poles for testing. C-shaped ferromagnetic magnet assemblies are also described in U.S. Pat. No. 6,075,364, which is assigned to the assignee of the present invention and is incorporated by reference, herein.

The ferromagnetic frame may also comprise a cylindrical side wall connected to opposing circular pole supports, as is also described in U.S. Pat. No. 6,201,394 B1, which is also assigned to the assignee of the present invention and is incorporated by reference, herein.

Use in other such systems may require changes in the positions of the gradient pick up coil 106 and sample coil 110 on the fixture 100 for proper positioning within an imaging volume, which are well within the capability of one of ordinary skill in the art, based on the teachings herein.

Also, while it is preferred that the test fixture be stored within the gap region of an MRI system, such as within the transmitting coil plate, for example, that is not required. The fixture may be stored outside of the MRI system and may be placed within the gap region or imaging volume when it is desired to conduct a test.

In addition, while it is preferred that the test fixture have deployed and undeployed positions to facilitate storage, that is not required, either.

One of skill in the art will understand that other modifications may be made to the embodiments described above without going beyond the scope of the present invention, which is defined by the following claims.

We claim:

1. A magnetic resonance imaging system comprising:
a magnetic resonance imaging ("MRI") assembly comprising a ferromagnetic frame, opposing first and second ferromagnetic poles supported by the ferromagnetic frame, the opposing first and second ferromagnetic poles defining a gap region therebetween, and a patient support within the gap region;
a computer; and
first and second test coils mechanically coupled to the MRI assembly during imaging, the first and second test coils being in different orientations with respect to the gap region;
the first and second test coils being selectively electrically coupled to the computer to provide test data related to operating characteristics of the system.

2. The magnetic resonance imaging system of claim 1, further comprising:
a container supported proximate the second test coil; and
a test substance within the container, the test substance capable of emitting a magnetic resonance signal.

3. The magnetic resonance imaging system of claim 1, wherein the first and second test coils are mechanically coupled to the assembly in the first and second orientations, respectively, during operation to collect test data.

4. The magnetic resonance imaging system of claim 3, wherein:
the first and second opposing poles each comprise respective pole faces each having a polar Y axis extending through a center of the pole faces, and an X axis, and a Z axis, each orthogonal to the Y axis and orthogonal to each other;
the first test coil is adapted to detect gradient magnetic fields generated by the gradient field coils;
the first test coil is positioned such that the first test coil is displaced from the X, Y and Z axes, during operation to collect test data; and
the second coil is positioned at the intersection of the X, Y, and Z axes during operation to collect test data.

5. The magnetic resonance imaging system of claim 1, further comprising:
a test fixture mechanically coupled to the MRI assembly, proximate the gap region;
wherein the first and second test coils are mechanically coupled to the test fixture.

6. The magnetic resonance imaging system of claim 5, wherein:
the test fixture is pivotally coupled to the MRI assembly within the gap region.

7. The magnetic resonance imaging system of claim 5, wherein:
the test fixture is deployable into a position within the gap region.

8. The magnetic resonance imaging system of claim 5, wherein:
the MRI assembly defines a chamber; and
the test fixture is pivotally coupled to the MRI assembly within the chamber.

9. The magnetic resonance imaging system of claim 5, wherein the MRI assembly wherein:
the test fixture is pivotally coupled to one of the opposing poles.

10. The magnetic resonance imaging system of claim 9, wherein the MRI assembly further comprises:
a first gradient coil plate adjacent to the first pole;
a second gradient coil plate adjacent to the second pole;
a first transmitter coil plate coupled to the first gradient coil plate; and
a second transmitter coil plate coupled to the second gradient coil plate;
wherein the test fixture is pivotally connected to the transmitting coil plate.

11. The magnetic resonance imaging system of claim 10, wherein:
the first transmitter coil plate defines a chamber for receiving the test fixture; and
the test fixture is pivotally connected to the plate, within the chamber.

12. The magnetic resonance imaging system of claim 11, wherein:
the test fixture has an undeployed, first position parallel to the plate, within the chamber; and
a deployed, second position extending from the chamber, into the gap region, to collect test data.

13. The magnetic resonance imaging system of claim 1, further comprising:
means for selectively coupling the first and second test coils to the computer.

14. The magnetic resonance imaging system of claim 5, wherein;
the test fixture further comprises a body portion and an arm pivotally coupled to the body portion;
the first test coil is supported by the body portion; and
the second test coil is supported by the arm.

15. The magnetic resonance imaging system of claim 14, wherein the test fixture comprises a telescoping section for adjusting the length of the main body.

16. The magnetic resonance imaging system of claim 14, further comprising:
a container supported by the arm, proximate the second coil; and
a test substance within the container, the test substance capable of emitting a magnetic resonance signal.

17. A method of operating a magnetic resonance imaging (MRI) system, the MRI system comprising a computer and an MRI assembly comprising a ferromagnetic frame, opposing ferromagnetic poles supported by the ferromagnetic frame, the opposing ferromagnetic poles defining a gap region therebetween, and a patient support within the gap region, the method comprising:
electrically coupling at least one test coil to the computer, the at least one test coil being mechanically coupled to the MRI assembly;
conducting a test procedure to evaluate at least one operating characteristic of the system, while the at least one test coil is electrically coupled to the computer;
detecting signals resulting from the test procedure by the at least one test coil;
decoupling the at least one test coil from the signal processing circuitry; and
conducting a magnetic resonance imaging scan with the magnetic resonance imaging system, while the test coil is mechanically coupled to the MRI assembly and decoupled from the computer.

18. The method of claim 17, further comprising:
deploying the at least one test coil into a position having a predetermined orientation within the gap region.

19. The method of claim 18, wherein the at least one coil is coupled to a test fixture pivotally coupled to the MRI assembly, the method comprising:
deploying the at least one coil by pivoting the test fixture from a first, storage position to a second, deployed position.

20. The method of claim 17, further comprising:
analyzing the detected signals by the computer.

* * * * *